United States Patent
Champion et al.

(10) Patent No.: US 7,227,182 B2
(45) Date of Patent: *Jun. 5, 2007

(54) OPTICAL PROPERTY NORMALIZATION FOR A TRANSPARENT ELECTRICAL DEVICE

(75) Inventors: David Champion, Lebanon, OR (US); Randy Hoffman, Corvallis, OR (US); Michael A. Pate, Tuscon, AZ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/145,484

(22) Filed: Jun. 2, 2005

(65) Prior Publication Data

US 2005/0224804 A1    Oct. 13, 2005

Related U.S. Application Data

(63) Continuation of application No. 10/643,571, filed on Aug. 19, 2003, now Pat. No. 6,940,097.

(51) Int. Cl.
*H01L 29/786* (2006.01)
*H01L 31/0232* (2006.01)

(52) U.S. Cl. .......................... 257/43; 257/72; 257/432; 257/59; 438/69; 438/72; 349/43; 349/118; 349/138

(58) Field of Classification Search .................. 257/43
See application file for complete search history.

(56) References Cited

U.S. PATENT DOCUMENTS

| | | | | |
|---|---|---|---|---|
| 5,386,306 A * | 1/1995 | Gunjima et al. | ............... | 349/89 |
| 5,777,700 A * | 7/1998 | Kaneko et al. | ............... | 349/39 |
| 6,356,326 B1 * | 3/2002 | Tamura et al. | ............... | 349/138 |
| 6,456,322 B1 * | 9/2002 | Marinacci | .................... | 348/158 |
| 6,489,642 B1 * | 12/2002 | America et al. | ............ | 257/232 |
| 6,713,785 B2 * | 3/2004 | Yagi | ............................ | 257/59 |
| 6,924,472 B2 * | 8/2005 | Losee et al. | ............. | 250/214.1 |
| 2002/0149018 A1 * | 10/2002 | Hirata | ......................... | 257/72 |

* cited by examiner

*Primary Examiner*—Jerome Jackson

(57) ABSTRACT

Optical property normalization for a transparent electrical device is described. In an embodiment, an electrical device includes a plurality of laterally displaced regions that are substantially transparent. Each region of the plurality of regions includes a normalized surface that has an optical property that has a normalized value that is substantially the same, one to another. One of the regions includes a portion of an electrical component. Additionally, at least one of the regions includes beneath the normalized surface an additional surface and a spectral normalization structure. The additional surface has a value for the optical property that is not substantially the same as the normalized value. The spectral normalization structure is disposed with the additional surface such that the normalized surface of the at least one region exhibits the normalized value.

23 Claims, 6 Drawing Sheets

OPTICAL PROPERTY NORMALIZATION FOR A TRANSPARENT ELECTRICAL DEVICE

This is a continuation of U.S. Ser. No. 10/643,571 filed Aug. 19, 2003 now U.S. Pat. No. 6,940,097.

TECHNICAL FIELD

The present invention generally relates to the field of electrical devices and more particularly to optical property normalization for a transparent electrical device.

BACKGROUND

Display devices are utilized in many aspects of modern life. From automobiles to televisions, display devices are provided to offer additional functionality to consumers. For example, display devices may be configured to allow the consumers to interact with computing devices, may be configured as a brake light of an automobile, and may provide a display of time as a wristwatch. Display devices may include a wide variety of devices, such as cathode-ray tubes (CRTs), liquid-crystal displays (LCDs), light-emitting diodes (LEDs), touch-screens, light-emitting polymers, and so on.

Display devices include electrical components that provide electrical functions for the operation of the display device, such as circuits that may include gate arrays, transistors, capacitors, diodes, and so forth. In some implementations of display devices, electrical components are disposed on a viewing surface to provide operation of the display, such as in a thin-film transistor (TFT) monitor. In such a display device, a pattern of lines and columns may be included that define a matrix of pixels on a substrate of a viewing surface of the display device. A thin layer of transistors is applied directly to the substrate such that each circuit is disposed on the pixel it controls. The electrical components, however, may interfere with light that is emitted by the display device. To reduce the interference, one or more of the electrical components may be formed of a transparent material. By forming the electrical components from transparent materials, a greater portion of the light generated by the display device may be transmitted, thereby increasing the brightness of the display device and decreasing the power consumed by the display device. Even though the electrical components are formed of transparent materials, however, the electrical components may still be perceptible by a viewer of the display device due to differences in optical properties of the electric components. The perceptibility of the transparent electrical components may distract from the display provided by the display device, thereby interfering with the viewing experience.

Therefore, it would be an advance in the art to provide optical property normalization for a transparent electrical device.

BRIEF DESCRIPTION OF THE DRAWINGS

The same reference numbers are used throughout the drawings to reference like features and components.

DETAILED DESCRIPTION

Overview

Optical property normalization for transparent electrical devices is described. In one embodiment of the present invention, an electrical device includes an exposed surface that exhibits substantially uniform values for an optical property and is substantially transparent to visible light. A plurality of thin film stacks is disposed between a semiconductor substrate and the exposed surface. The plurality of this film stacks are laterally displaced one to another. Each of the plurality of thin film stacks has a top surface that exhibits a value for the optical property that is different from a value for the optical property of at least one other top surface.

In an additional embodiment of the present invention, an integrated circuit includes a plurality of laterally displaced regions that are substantially transparent. Each region of the plurality of regions includes a normalized surface that has an optical property that has a normalized value that is substantially the same, one to another. One of the regions includes a portion of an electrical component. Additionally, at least one of the regions includes beneath the normalized surface an additional surface and a spectral normalization structure. The additional surface has a value for the optical property that is not substantially the same as the normalized value. The spectral normalization structure is disposed with the additional surface such that the normalized surface of the at least one region exhibits the normalized value.

FIGS. 1 through 7 illustrate exemplary embodiments of optical property normalization for a transparent electrical device. The electrical devices in each embodiment of the present invention may be configured for use in a variety of applications, such as in a semiconductor device, integrated circuit, display device, solar panel, and so on. Although the following discussion will describe optical property normalization for a transparent electrical device in a display device application, a variety of applications are contemplated.

Figure 1:
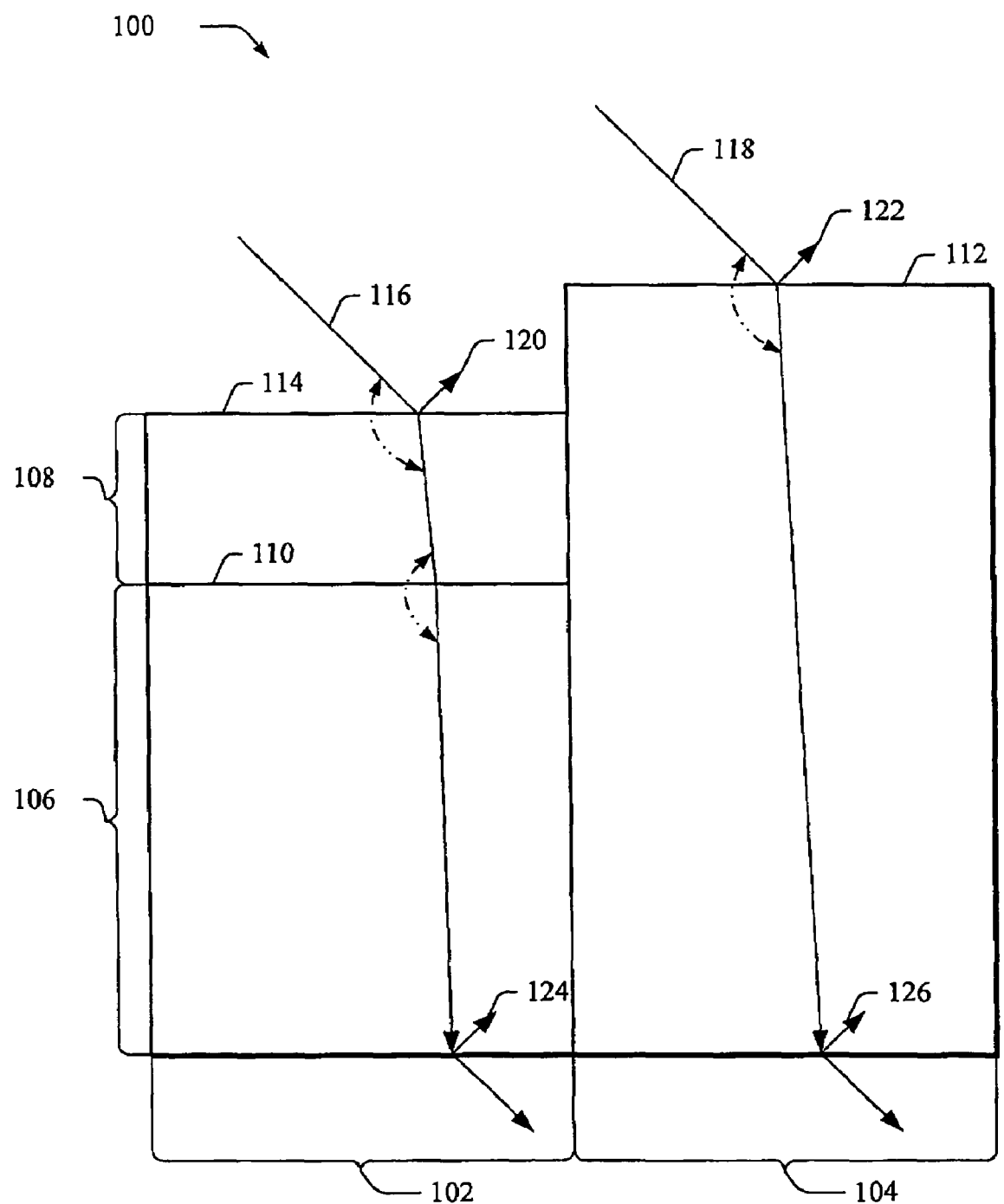
FIG. 1 is an illustration of an exemplary embodiment of the present invention showing a cross-sectional view of an electrical device that includes first and second regions that are made of transparent materials.

FIG. 1 is an illustration of an exemplary embodiment of the present invention that shows a cross-sectional view of an electrical device 100 that includes laterally displaced first and second regions 102, 104 that are made of materials that are substantially transparent to visible light. If a material is substantially transparent, light that is transmitted through the material is nearly or wholly undiffused. For instance, an image that is transmitted through a substantially transparent material is visible to the human eye.

The first region 102 includes at least a portion of an electrical component 106. For example, the electrical component may be configured as a semiconductor device, such as a transistor. The portion of the electrical component 106 may be configured as a portion of the transistor, such as an interconnect, a source/drain region, and so on.

The first and second regions 102, 104 may be formed from a variety of transparent materials. For example, the transparent materials may include conductors, such as indium tin oxide (ITO) and ZnO that is doped with aluminum, indium, and the like. The transparent materials may also include semiconductors, such as ZnO, $SnO_2$, and $In_2O_3$. Further, the transparent materials may include dielectrics, such as $Si_2O_2$, $Si_3N_4$, $Al_2O_3$, and $HfO_2$. The examples of transparent materials are exemplary only and are not exhaustive.

The portion of the electrical component 106 and the second region 104, however, may be perceptible to the human eye even when made of transparent materials due to spatial patterns that arise from varying optical properties of the transparent materials. For example, visible light that is transmitted through the portion of the electrical component 106 and the second region 104 may have different colors due to differences in transparent materials that are utilized to form the portion of the electrical component 106 and the second region 104, respectively. Thus, even though the portion of the electrical component 106 and the second region 104 are substantially transparent to visible light, the portion of the electrical component 106 may be perceptible with respect to the second region 104, and vice versa.

Optical properties of the first and second electrical regions 102, 104 may be normalized such that spatial patterns are not perceptible to the human eye. In this way, a transparent electrical device 100 is achieved that includes first and second regions 102, 104 that are imperceptible to the human eye, one to another. The optical properties of the first and second regions 102, 104 may be normalized through use of a spectral normalization structure 108. The spectral normalization structure 108 may be formed from one or more spectral normalization materials. Spectral normalization materials may be selected from a wide range of materials having different optical properties, such as $SiO_2$, SiO, $Si_3N4$, $Ta_2O_5$, $Al_2O_3$, MgF, MgO, $ZrO_2$, $CeO_2$, $HfO_2$, $Sc_2O_3$, $ThF_4$, $YF_3$, $Y_2O_3$, and $AlF_3$. The listing of exemplary spectral normalization materials is exemplary only and is not exhaustive.

In the illustrated embodiment, the spectral normalization structure 108 is disposed with the portion of the electrical component 106 such that a value of an optical property of the first region 102 is substantially equivalent to a value for the optical property of the second region 104. For example, the portion of the electrical component 106 includes a first surface 110, e.g. a top surface, which has an optical property that has a first value. The second region 104 includes a second surface 112 that has the optical property that has a second value that is different from the first value of the first surface 110. The spectral normalization structure 108 is disposed with the portion of the electrical component 106 in the first region 102. The spectral normalization structure 108 in combination with the portion of the electrical component 106 provides a third surface 114 that has the optical property that has a value that is substantially the same as the second value for the second surface 112. In this way, the first and second regions 102, 104 each include respective normalized surfaces, e.g. the second and third surfaces 112, 114, that have respective normalized values for the optical property.

There are a variety of optical properties that may be normalized, such as absorption, reflection, and transmission. The optical properties may also be normalized over various ranges of wavelengths, such as wavelengths of light across the visible spectrum, e.g. light having wavelengths from approximately 400 to 700 nanometers (nm). The following discussion will address each of these optical properties in turn and provide examples of normalization of each of the optical properties.

Absorption is an optical property that describes the fraction of light that is lost through absorption of photons by a medium. Absorption is a function of a path length "L" through the medium and the absorption coefficient "α" of the medium, and is represented by a ratio of the amount of light "I" that passes through the medium to the amount of light "$I_o$–R" entering the medium ($I_o$ is the amount of light incident on the medium surface, R is the amount of light reflected from the surface), which is shown as follows:

$$\frac{I}{I_o - R} = e^{-\alpha L}$$

As stated previously, the first region 102 includes the portion of the electrical component 106. The portion of the electrical component 106 has the first surface 110 which has the optical property having the first value, which in this embodiment is absorption. The first value is different from the second value for the absorption of the second surface 112 of the second region. The different absorptions may result in the perceptibility of the respective first and second regions 102, 104 with respect to each other. To normalize the absorption of the first surface 110 of the first region 102 with the absorption of the second surface 112 of the second region 104, the spectral normalization structure 108 is utilized. The spectral normalization structure 108 is disposed with the portion of the electrical component 106. Although the spectral normalization structure 108 is illustrated as disposed over the portion of the electrical component 106, the spectral normalization structure 108 may be disposed beneath the portion of the electrical component 106, between layers (not shown here) of the portion of the electrical component 106, and the like.

The spectral normalization structure 108, when disposed with the portion of the electrical component 106, provides the third surface 114 exhibiting the third value for the absorption that is substantially equivalent to the second value for the absorption at the second surface 112 of the second region 104. In this way, absorption of the first region 102 (i.e., the combination of absorptions of the portion of the electrical component 106 and the spectral normalization structure 108) is substantially equivalent to the absorption of the second region 104.

Colorization is an optical property that is observable by the human eye because of absorption and/or reflection of wavelengths of light in the visible spectrum. Both absorption and reflection occur due to interaction between a medium and light. If the wavelength of absorbed and/or reflected light is in the visible spectrum, a color will be perceived. The spectral normalization structure may be supplied such that color is normalized between the first and second regions 102, 104. The color may be normalized through a combination of one or both of absorption and reflection, absorption alone or reflection alone. For example, a combination of the spectral normalization layer 108 and the portion of the electrical component 106 may absorb substantially equivalent amounts of light at the same respective wavelengths of light as the second region 104.

Reflection is an optical property that describes a "bouncing" of light off of a surface. The law of reflection states that an angle of incidence equals an angle of reflection. An angle of reflection is an angle between a reflected light wave and a normal drawn at a point of incidence to a reflecting surface. Reflection is illustrated in FIG. 1 as first and second light waves 116, 118 having respective first and second reflected light waves 120, 122. Reflection may also include internal reflection. Internal reflection describes the passage of light between media of different optical densities, which results in a portion of the light being reflected at the interface. This is illustrated in FIG. 1 as first and second internally reflected light waves 124, 126. Internal reflection may result in "fringing," e.g. alternating light and dark bands of light, which may be perceptible by a human eye. Reflection may be quantified in a variety of ways, such as a percentage of the amount of light that is reflected when striking a surface.

The portion of the electrical component 106 and the second region 104 may have different values for reflection. To normalize reflection, the spectral normalization structure 108 is provided such that reflection for a combination of the spectral normalization structure 108 and the portion of the electrical component 106 is substantially the same as the reflection of the second region 104. In other words, the total reflection (surface and internal) of the first region 102 measured at the third surface 114 is substantially the same as the total reflection of the second region 104 when measured at the second surface 112. In this way, reflection for the first region 102 is substantially equivalent to the second region 104.

Transmission is an optical property that describes a fraction of light waves that are transmitted through a medium that are not lost through absorption and/or reflection of the light by the medium. Transmission of the first and second regions 102, 104 may also be normalized, one to another, through use of the spectral normalization structure 108 such that transmission of a combination of the portion of the electrical component 106 and the spectral normalization structure 108 is substantially equivalent to transmission of the second region 104 at the respective third and second surfaces 114, 112.

Figure 2A:
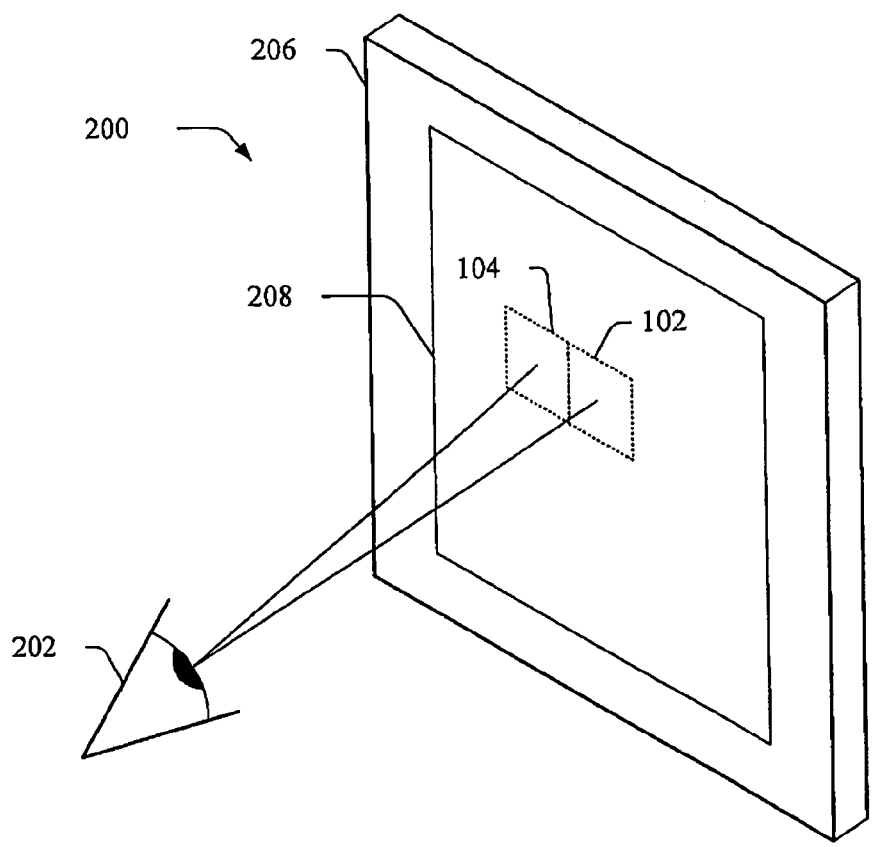
FIG. 2A is an illustration of an exemplary embodiment of the present invention showing an isometric view of a display device that includes the electrical device of FIG. 1.
Figure 2B:
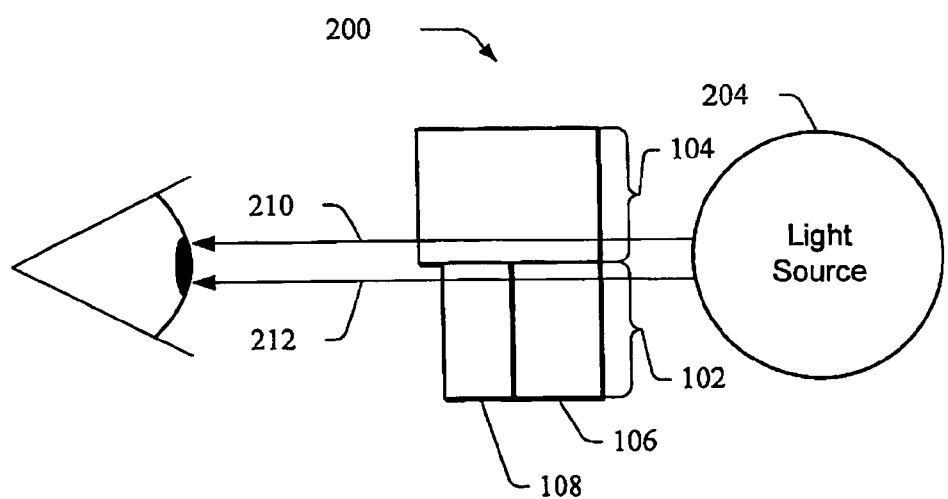
FIG. 2B is an illustration of an exemplary embodiment of the present invention showing a cross-sectional view of the display device of FIG. 2A.

FIGS. 2A and 2B are illustrations of an exemplary embodiment of the present invention in which the electrical device 100 of FIG. 1 is included in a display device 200 that is viewed by a human eye 202. The display device 200 is illustrated in FIG. 2A in an isometric view. The display device 200 is illustrated in FIG. 2B in a cross-sectional view that is taken perpendicular to the axis of light being transmitted from the light source 204 to the human eye 202. The display device 200 includes a housing 206 having the light source 204 and a transparent device 208. The light source 204 is disposed in the housing 206. Light 210, 212 emitted from the light source 204 is transmitted through the transparent device 208 that is attached to the housing 206 to be viewed by the human eye 202. The display device 200 may be configured as a variety of devices, such as a cathode ray tube (CRT), a liquid-crystal display (LCD), a light-emitting diode (LED) device, light-emitting polymer device, and so on.

Through use of the spectral normalization structure 108, light 210, 212 transmitted through the respective first and second regions 102, 104 encounters substantially equivalent optical properties. For example, light 210, 212 may be absorbed, refracted and/or reflected in substantially equivalent amounts. In this way, the first and second regions 102, 104 are imperceptible, one to another, by the human eye 202.

In an exemplary embodiment of the present invention, the transparent device 208 that includes the first and second regions 102,104, while substantially transparent, may have optical properties that result is some overall perceptibility of the transparent device 208 as a whole. For instance, the optical properties of the first and second regions 102, 104 are normalized to each other such that the first and second regions 102, 104 are imperceptible with respect to each other. Light 210, 212 transmitted through the transparent device 208, however, may have a particular color, such as a bluish tinge. Even though the light 210, 212 has a particular color, both the first and second regions 102, 104 have the same bluish tinge, and therefore are imperceptible, one to another.

Although general values for optical properties have been discussed, the optical properties may be normalized across a range of wavelengths of visible light, such as a portion of the electromagnetic spectrum that is visible by the human eye 202. For example, transmission may be normalized such that different regions share similar transmission spectra across the visible spectrum. The following exemplary embodiment of the present invention provides one such example of normalization across a range of wavelengths of visible light.

Figure 3:
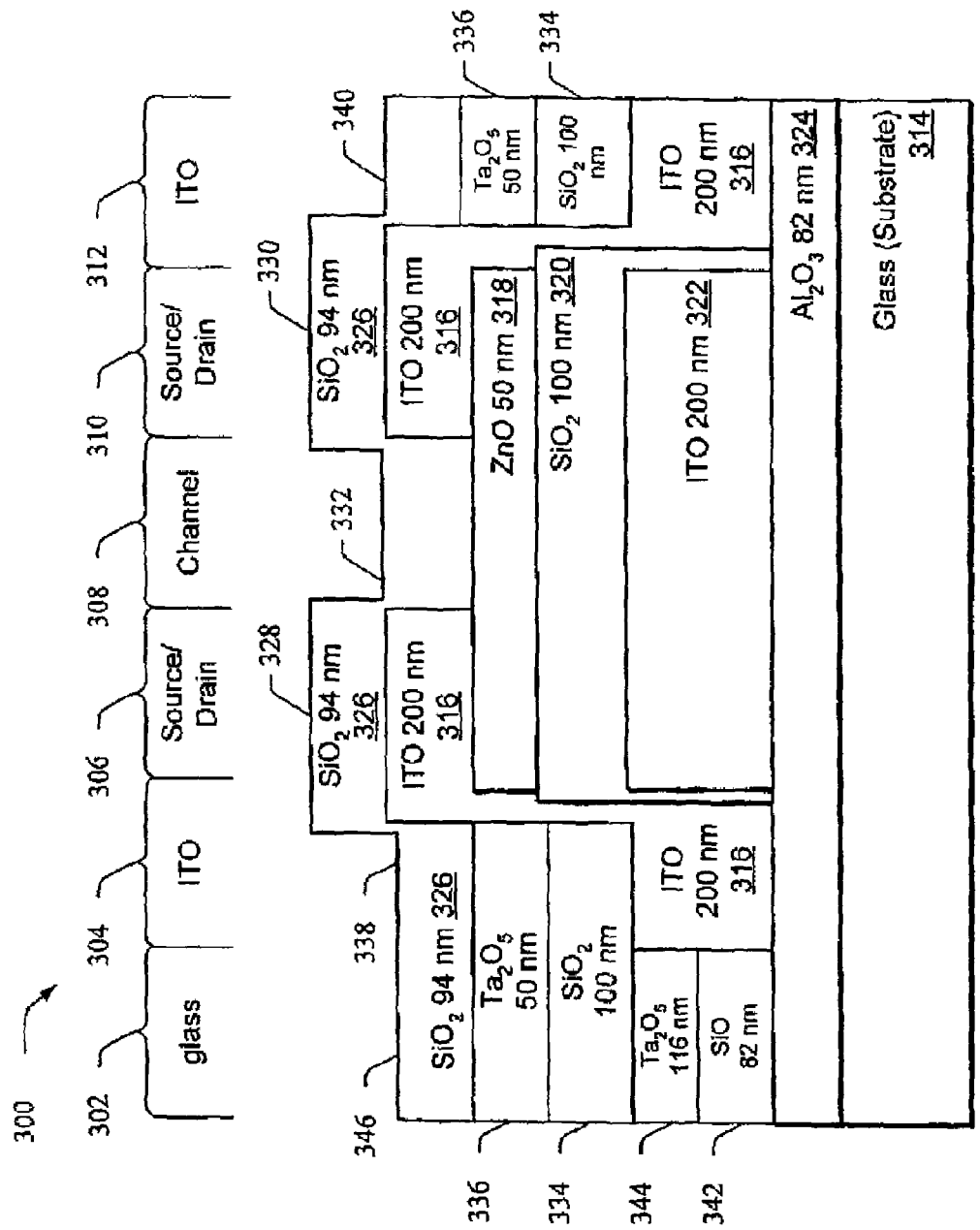
FIG. 3 is an illustration of an exemplary embodiment of the present invention showing an electrical device that includes regions that include thin-film stacks.

FIG. 3 is an illustration of an exemplary embodiment of the present invention in which an electrical device 300 includes first, second, third, fourth, fifth and sixth regions 302, 304, 306, 308, 310, 312 that are configured as thin-film stacks. The thin-film stacks may form a portion of an integrated circuit that includes a plurality of transistors, capacitors, diodes, and so forth. The second, third, fourth, fifth and sixth regions 304-312 include structures that form a ZnO bottom-gate transparent thin-film transistor that is disposed over a substrate 314. For example, the second and sixth regions 304, 312 include a 200 nm layer 316 of ITO that forms interconnects of the ZnO transistor. The third and fifth regions 306, 310 are formed as source/drain regions of the ZnO transistor. To form the source/drain regions, the third and fifth regions 306, 310 each include the 200 nm layer of ITO 316 along with a 50 nm layer 318 of ZnO, a 100 nm layer 320 of $SiO_2$, and an additional 200 nm layer 322 of ITO. The fourth region 308 is formed as a channel of the ZnO transistor, which is formed from the 50 nm layer 318 of ZnO, the 100 nm layer 320 of $SiO_2$, and the 200 nm layer 322 of ITO. The first region 302 does not include a portion of the ZnO transistor.

Overlap region at edges between electrical components of the ZnO transistor (i.e., between the second and third regions 304, 306) may be encountered due to resolution limitations of a relevant patterning method (e.g., photolithography) and by edge/step coverage considerations. The overlap, however, in embodiments of the present invention may be dimensionally small enough so as to be negligible from an optical perspective. For example, the overlap may be small enough such that it is not perceptible by the human eye.

As previously stated, because transparent materials that are utilized to form a transparent electrical device may have different optical properties which are a result of the materials themselves as well as the thickness of the materials, the electrical device may be perceptible. In the illustrated embodiment of FIG. 3, a spectral normalization structure is provided that is formed from multiple layers of optical coatings that are applied to normalize desired optical properties. The optical coating layers are wide bandgap insulators that do not affect the electrical components of the electrical device 300 from an electrical perspective (i.e., current leakage pathways are not introduced within portions of the electrical component or between adjacent portions of the electrical component). Although the following example will address normalization of optical properties of transmission and reflection, other optical properties may also be normalized as desired.

In an embodiment of the present invention, to normalize transmission and reflection when making the electrical device 300, the substrate 314 and the layers 316-322 which form the ZnO transistor are analyzed to find differences in optical properties. In the current embodiment, the analysis is performed during the planning stages of the electrical device 300. In additional embodiments of the present invention, analysis may be performed for structures that are already formed on a substrate. The spectral normalization structures may be provided on the layers 316-322 forming the ZnO transistor, beneath the layers 316-322 forming the ZnO transistor (i.e. between the layers 316-322 and the substrate 314), and/or between the layers 316-322 forming the ZnO transistor.

In an embodiment of the present invention, the region having the least desirable value for an optical property is used as a baseline for normalizing other regions of an electrical device. For example, when the electrical device 300 is analyzed, the source/drain structure in the third and fifth regions 306, 310 may be found to transmit the least amount of visible light and have the most reflection when compared with the substrate 314 of the first region 302 and when compared with the structures in the second, fourth and sixth regions 304, 308, 312, respectively. A spectral normalization structure is formed which includes an 82 nm layer 324 of $Al_2O_3$ that is disposed between the substrate 314 and the layers 316-322 forming the source/drain structure of the ZnO transistor. The layer 324 improves transmission and reduces reflection between the layer 322 of ITO and the substrate 314. The spectral normalization structure also includes a 94 nm layer 326 of silicon dioxide that is disposed on a top surface of the layer 316 of ITO. The layer 326 of silicon dioxide has optical properties that reduce reflection and thereby increase transmission of the third and fifth regions 306, 310. The exposed surfaces 328, 330 of the respective third and fifth regions 306, 310 have values for the optical properties of transmission and reflection that are used as a baseline to normalize the first, second, fourth and sixth regions 302, 304, 308, 312.

The layers 318-322 that form the channel for the ZnO transistor in the fourth region 308 may have different values for transmission and reflection properties than the third and fifth regions 306, 310. For example, the fourth region 308 may have a lower value for reflection than the third and fifth regions 306, 310. Therefore, a spectral normalization structure is formed for the fourth region 308 that includes the 82 nm layer 324 of $Al_2O_3$ and the 94 nm layer 326 of silicon dioxide. The spectral normalization structure, when disposed with the layers 318-322 that form the channel, provide an exposed surface 332 having values for transmission and reflection that are substantially the same as the values for the exposed surfaces 328, 330 of the respective third and fifth regions 306, 310. In this way, the optical properties of the layers 318-322 that form the channel in the fourth region 308 are normalized with the optical properties of the third and fifth regions 306, 310.

Likewise, the second and sixth regions 304, 312 may also be normalized to the third, fourth and fifth regions 306, 308, 310. For instance, both the second and sixth regions 304, 312 may have spectral normalization structures that include the 94 nm layer 326 of silicon dioxide and the 82 nm layer 324 of $Al_2O_3$. The second and sixth regions 304, 312 may also include a 100 nm layer 334 of silicon dioxide and a 50 nm layer 336 of $Ta_2O_5$. In this way, both the second and sixth regions 304, 312 include a spectral normalization structure that provides respective surfaces 338, 340 having values for the optical properties of transmission and reflection that are substantially the same as the respective values for the exposed surfaces 328, 332, 330 of the respective third, fourth and fifth regions 306, 308, 310.

Portions of the substrate 314 that do not include a portion of the ZnO transistor may also be normalized. For instance, the first region 302 may include a spectral normalization structure that includes the 94 nm layer 326 of silicon dioxide, the 82 nm layer 324 of $Al_2O_3$, the 100 nm layer 334 of silicon dioxide, and the 50 nm layer 336 of $Ta_2O_5$. The first region 302 may also include a 82 nm layer 342 of silicon monoxide and a 116 nm layer 344 of $Ta_2O_5$. Thus, the first region 302 is also provided with an exposed surface 346 having values for the optical properties which are substantially the same as the values at the respective surfaces 338, 328, 332, 330, 340 for the optical properties of reflection and transmission for the second, third, fourth, fifth and six regions 304-312.

Through use of the spectral normalization structures, the electrical device 300 is provided with an exposed surface that exhibits substantially uniform values for the optical properties of transmission and reflection. The exposed surface of the electrical device 300 includes the exposed surfaces 346, 338, 328, 332, 330, 340 of the respective first, second, third, fourth, fifth and sixth regions 302, 304, 306, 308, 310, 312. Each of the regions 302-312 includes a thin film stack that is disposed between the semiconductor substrate 314 and the exposed surface of the electrical device 300. Additionally, each of the thin film stacks has a top surface that exhibits a value for the optical property of transmission and reflection that is different from a value for the optical property of at least one other top surface. For example, a top surface of the thin film stack in the second region that includes the layer 316 of ITO has values for the optical properties of transmission and reflection that are different from values for transmission and reflection of a top surface of the substrate 314 of the first region 302.

The electrical device 300 shown in FIG. 3 may be formed in a variety of ways. For example, films may be deposited and patterned in the following order. First, the 82 nm layer 324 of $Al_2O_3$ that is included in each of the spectral normalization structures of the first, second, third, fourth, fifth, and sixth regions 302-312 is deposited on the substrate 314. Second, the 82 nm layer 342 of silicon monoxide and a 116 nm layer 344 of $Ta_2O_5$ are deposited and patterned for inclusion in the first region 302. Third, the 200 nm layer 322 of ITO is deposited and patterned for inclusion in the third, fourth and fifth regions 306-310. Fourth, the 100 nm layer 320 of silicon dioxide is deposited and patterned for inclusion in the third, fourth and fifth regions 306-310. Fifth, the 50 nm layer 318 of ZnO is deposited and patterned for inclusion in the third, fourth and fifth regions 306-310. Sixth, the 200 nm layer of ITO 316 is deposited and patterned for inclusion in the second, third, fifth and sixth regions 304, 306, 310, 312. Seventh, the 100 nm layer 334 of silicon dioxide and the 50 nm layer 336 of $Ta_2O_5$ are deposited and patterned in the first, second and sixth regions 302, 304, 312. Lastly, the 94 nm layer 326 of silicon dioxide is deposited in each of the first, second, third, fourth, fifth and sixth regions 302-312.

Figure 4:
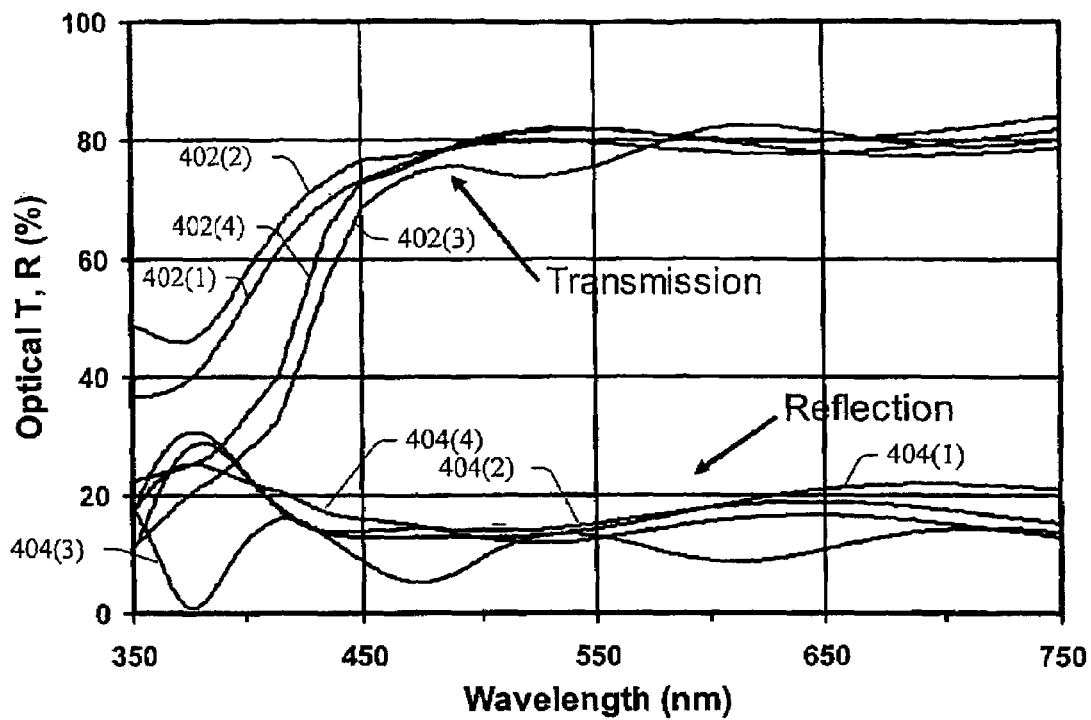
FIG. 4 is an illustration of an exemplary embodiment of the present invention showing transmission and reflection spectra for the electrical device shown in FIG. 3 for a portion of the electromagnetic spectrum that is visible to a human eye.

FIG. 4 is an illustration of a graph 400 showing transmission and reflection spectra for the electrical device 300 shown in FIG. 3 for a portion of the electromagnetic spectrum that is visible to a human. The visible light is included in the portion of the electromagnetic spectrum having wavelengths between approximately 400 and 700 nm. To simplify the previous discussion in relation to FIGS. 1-3, general values were discussed for optical properties that were normalized. Values for optical properties may also be normalized across a range of wavelengths, such as the visible spectrum illustrated in FIG. 4. FIG. 4 illustrates optical transmission and reflection for each of the first, second, third, fourth, fifth and sixth regions 302-312 of the electrical device 300 shown in FIG. 3 at a range of wavelengths of visible light. The first region 302 of FIG. 3 has a line 402(1) that is plotted for values of transmission at each wavelength of visible light. The second and sixth regions 304, 312 have equivalent structures, and thereby share a line 402(2) that is plotted for values of transmission at each respective wavelength of visible light. Likewise, the third and fifth regions 306, 310 of FIG. 3 have equivalent structures, and thereby share a line 402(3) that is plotted for values of transmission at each respective wavelength of visible light. The fourth region 308 of FIG. 3 also has a line 402(4) that is plotted for values of transmission at each wavelength of visible light.

Similarly, the first region 302 of FIG. 3 has a line 404(1) that is plotted for values of reflection at each wavelength of visible light. The second and sixth regions 304, 312 of FIG. 3 share a line 404(2) that is plotted for values of reflection at each respective wavelength of visible light. Likewise, the third and fifth regions 306, 310 of FIG. 3 share a line 404(3) that is plotted for values of reflection at each respective wavelength of visible light. The fourth region 308 of FIG. 3 has a line 404(4) that is plotted for values of reflection at each wavelength of visible light.

As illustrated, even though transmission and reflection occur at varying degrees for each line 402(1)-402(4) for transmission and each line 404(1)-404(4) for reflection, respective values at each wavelength are substantially the same. In other words, the "troughs" and "peaks" of the lines 402(1)-402(4) for transmission and the lines 404(1)-404(4) for reflection generally correspond at each of the wavelengths, one to another. For example, when the values for the optical property are plotted on a graph having a first axis that describes the values of the optical property (i.e., the Y axis in FIG. 4) and a second axis that describes wavelengths of visible light (i.e., the X axis in FIG. 4), the plotted substantially uniform values are substantially the same over a substantial portion of the wavelengths of visible light. In this way, the first, second, third, fourth, fifth and sixth regions 302-312 of FIG. 3 are substantially imperceptible to a human eye viewing light that passes through the electrical device 300.

Figure 5:
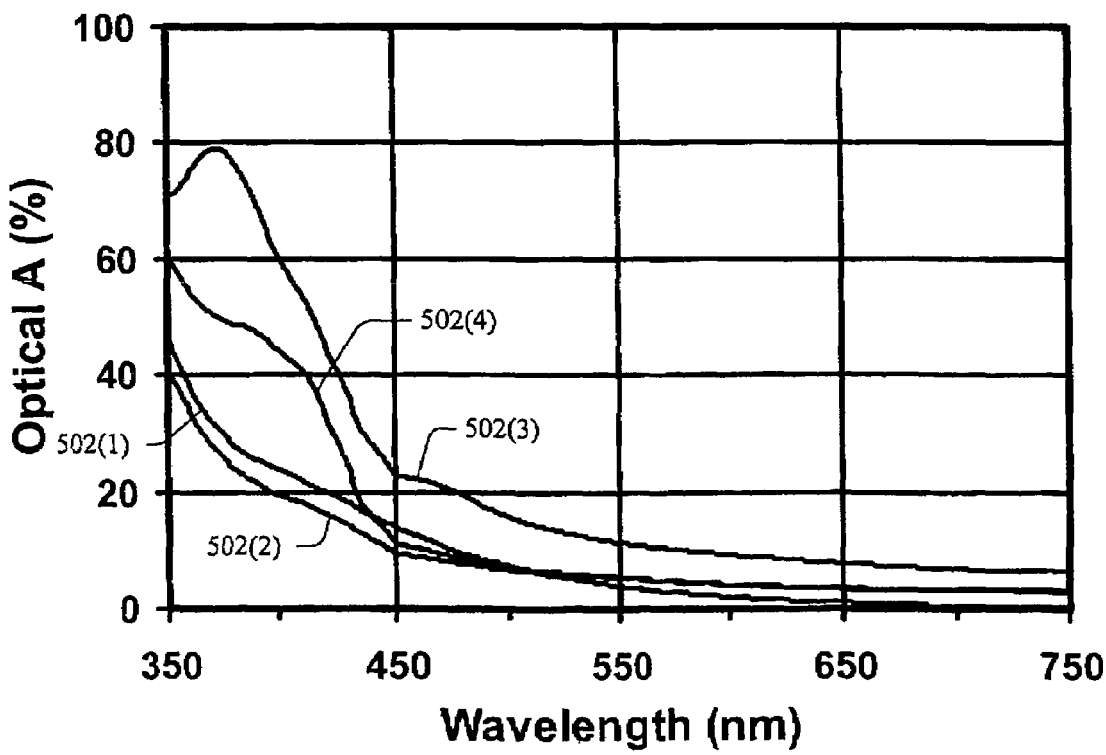
FIG. 5 is an illustration of an exemplary embodiment of the present invention showing absorption spectra for the electrical device shown in FIG. 3 for a portion of the electromagnetic spectrum that is visible to a human eye.

FIG. 5 is an illustration of a graph 500 showing absorption spectra for the electrical device 300 shown in FIG. 3 for a portion of the electromagnetic spectrum that is visible to a human eye. The first region 302 of FIG. 3 has a line 502(1) that is plotted for values of absorption at each wavelength of visible light. The second and sixth regions 304, 312 of FIG. 3 have equivalent structures, and thereby share a line 502(2)
that is plotted for values of absorption at each respective wavelength of visible light. Likewise, the third and fifth regions 306, 310 of FIG. 3 have equivalent structures, and thereby share a line 502(3) that is plotted for values of absorption at each respective wavelength of visible light. The fourth region 308 of FIG. 3 has a line 502(4) that is plotted for values of absorption at each wavelength of visible light.

Absorption can be calculated from transmission and reflection, since the sum of absorption, transmission, and reflection equals 1 (100%). Therefore, the lines 502(1)-502(4) shown in FIG. 5 correspond to the lines 402(1)-402(4) for transmission and the lines 404(1)-404(4) for reflection shown in FIG. 4. The lines 502(1)-502(4) that plot the values for absorption are also substantially the same at each respective wavelength of visible light. As stated previously, color is dependent on absorption and reflection of light at various wavelengths in the visible spectrum. Therefore, by providing corresponding absorption and reflection, uniform colorization of the electrical device 300 of FIG. 3 may be achieved. In this way, even though light that is transmitted through and/or reflected from the electrical device 300 may have a color, the first, second, third, fourth, fifth and sixth regions 302-312 of FIG. 3 may be imperceptible, one to another, by a human eye viewing the transmitted and/or reflected light.

Figure 6:
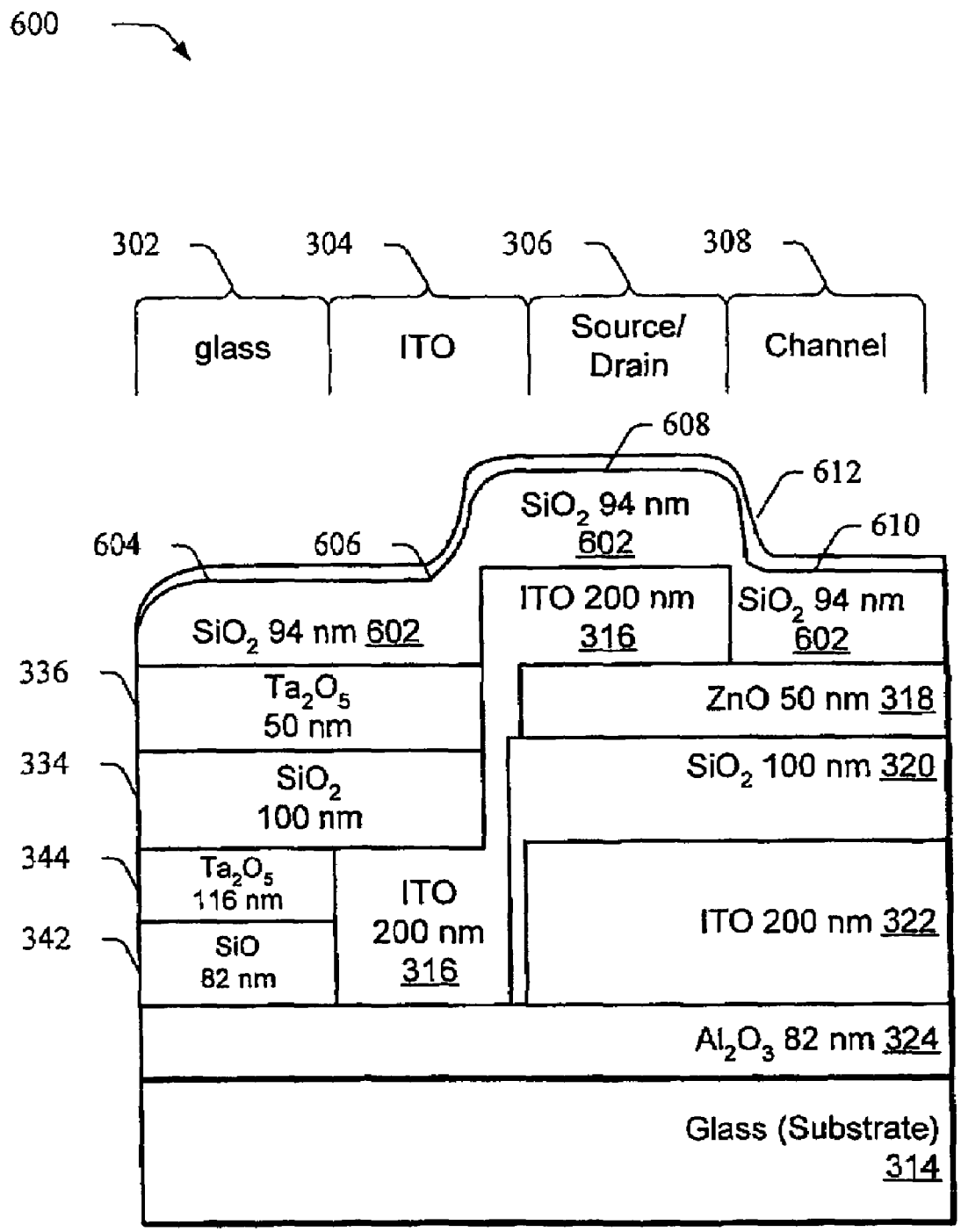
FIG. 6 is an illustration of an exemplary embodiment of the present invention showing an electrical device that includes a spectral normalization structure having rounded edges.

FIG. 6 is an illustration of an exemplary embodiment of the present invention showing a portion 600 of the electrical device 300 shown in FIG. 3 that includes a spectral normalization structure having rounded edges. Diffracted light is caused when light is deflected by sharp edges, thereby providing fringes of light and dark bands. Thus, sharp edges may result in perceptibility of the sharp edge, and therefore a region that includes the sharp edge. In FIG. 6, the portion 600 of the electrical device 300 of FIG. 3 is illustrated that includes the first, second, third, and fourth regions 302, 304, 306, 308. In this embodiment, however, a layer 602 of silicon dioxide has rounded edges. In other words, the exposed surfaces 604, 606, 608, 610 at which the optical properties are normalized are rounded to reduce sharp edges. By providing the rounded edges, diffraction is reduced, thereby promoting the imperceptibility of the first, second, third and fourth regions 302-308 of the portion of the electrical device 600.

Rounded edges may be provided in a variety of ways. In one embodiment of the present invention, the layer 602 of silicon dioxide is over-coated on the first, second, third and fourth regions 302, 304, 306, 308 utilizing chemical vapor deposition. A portion of the over-coated layer 602 of silicon dioxide is then removed utilizing a reactive ion etch.

Although the use of rounded edges has been described for reducing diffraction at sharp edges, diffraction may also be reduced in a variety of other ways. In another embodiment of the present invention, the spectral normalization structure includes one or more optical diffuser sheets 612, which may also be referred to as brightness enhancing films (BEFs). The optical diffuser sheets randomize diffracted light and control the exit angle of light through the portion 600 of the electrical device.

Figure 7:
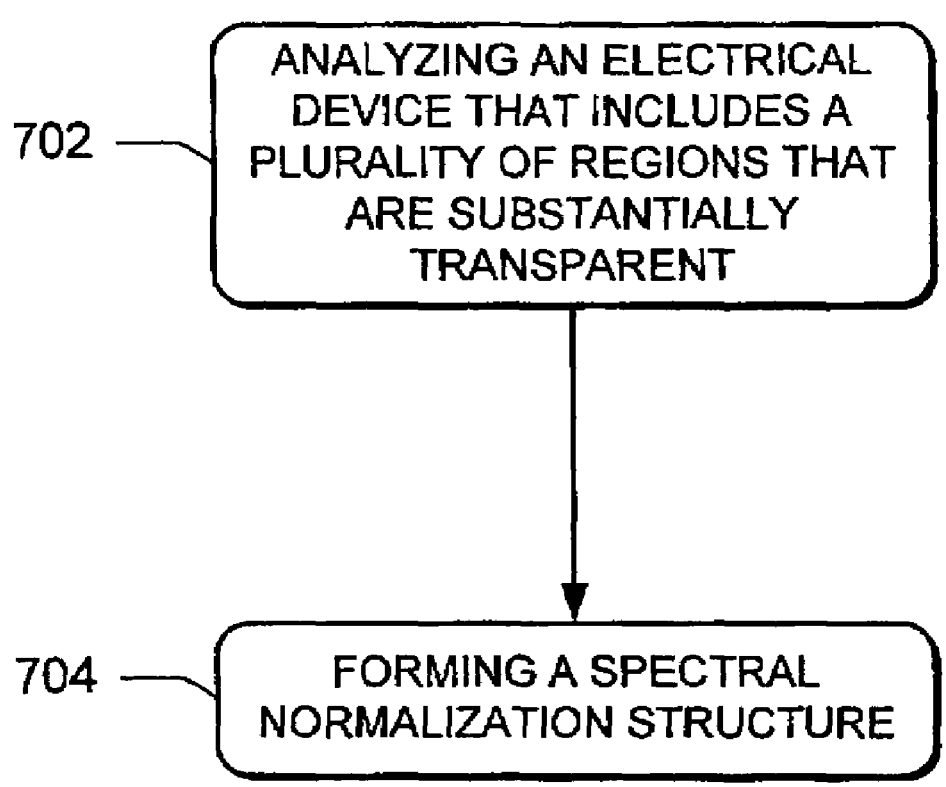
FIG. 7 is a flow chart depicting a procedure in an exemplary embodiment of the present invention showing a method of making an optically normalized transparent electrical device.

FIG. 7 is a flow chart depicting a procedure 700 in an exemplary embodiment of the present invention wherein a method of making an optically normalized transparent electrical device is shown. At block 702, an electrical device is analyzed that includes a plurality of laterally displaced regions each being substantially transparent to visible light. One of the regions includes at least a portion of an electrical component. The plurality of regions include a first region and a second region. The first region has a top surface having an optical property that has a value that is not substantially the same as a value of the optical property of a top surface of the second region. The first and second regions may be analyzed in a variety of ways, such as through measurements taken of a formed electrical device having the first and second regions, computer simulations of materials and thickness of the first and second regions, and so forth.

The first and second regions are analyzed to find a value for an optical property for the first region that is different from a value for the optical property of the second region. For example, the top surface of the first region may have a value "90 percent" for the optical property "transmission" that specifies that 90 percent of the light striking the first region is transmitted through the first region. The top surface of the second region has a value "80 percent" for the optical property "transmission." Other optical properties include absorption, color, emission, reflection and refraction.

At block 704, a spectral normalization structure is formed based on the analysis performed at block 702. The spectral normalization structure is disposed with at least one of the first and second regions such that each region of the plurality of regions has a value for the optical property that is substantially the same, one to another. For example, in one embodiment, the spectral normalization structure is disposed with the first region that has the top surface having the value of 90 percent for the optical property transmission. The spectral normalization structure normalizes the value 90 percent of the first region such that the value for the combination of the first region and the spectral normalization structure is substantially equivalent to the value of 80 percent for the optical property transmission for the second region. In other words, in this embodiment, the spectral normalization structure reduces the transmission of the first region to match the transmission of the second region. The spectral normalization structure thereby provides an exposed surface having a value for the optical property that is substantially the same as the second value for the optical property of the second region.

In another embodiment, the spectral normalization structure is combined with the second region that has the top surface that has the value of 80 percent for the optical property transmission. The spectral normalization structure normalizes the value of the second region such that the value for the combination of the second region and the spectral normalization structure is substantially equivalent to the value of 90 percent for the optical property transmission for the first region. In this embodiment, the spectral normalization structure increases the transmission of the second region to match the transmission of the first region. Thus, in this embodiment, the spectral normalization structure provides a exposed surface in the second region that is substantially the same as the value for the optical property of the first region.

In a further embodiment, the spectral normalization structure is included with both the first and second regions to normalize the optical property, one to another. For example, different thicknesses of spectral normalization material may be supplied respectively to the first and second regions to normalize the transmittance. A first thickness of spectral normalization material, for instance, may be applied to the first region that decreases transmittance of the first region. A second thickness of spectral normalization material may be applied to the second region that increases transmittance of the second region. In this way, both the first and second regions may include a spectral normalization structure that normalizes an optical property. Therefore, in this embodiment, the spectral normalization structures provides exposed surfaces at both the first and second regions that have substantially the same values for the optical property, one to another.

A variety of fabrication techniques may be employed to form the spectral normalization structure. For example, the fabrication techniques may include deposition, etching, photolithography, micromachining, and other semiconductor fabrication processes. In one embodiment, the spectral normalization structure is deposited in spatial patterns on portions of electrical components of an electrical device. The spatial patterns may have varying thickness and materials that are based on the optical properties of the underlying electrical device. The spectral normalization structure may be deposited, deposited and etched back, deposited and photoablated back, and formed using other semiconductor fabrication processes.

The use of the spectral normalization structure reduces the degree of variation in optical properties in regions of the electrical device. In addition, the spectral normalization structure may increase average transmission as a result of reduced reflection and absorption. Interference effects may also be reduced, yielding flatter transmission and reflection spectra through the visible region.

Although the invention has been described in language specific to structural features and methodological steps, it is to be understood that the invention defined in the appended claims is not necessarily limited to the specific features or steps described. Rather, the specific features and steps are disclosed as preferred forms of implementing the claimed invention.

What is claimed is:

1. An electric device comprising:
 a) an exposed surface that:
  i) exhibits an optical property substantially uniform along a lateral spatial dimension of the exposed surface, and
  ii) is substantially transparent to visible light; and
 b) a plurality of thin film stacks:
  disposed between a substrate and the exposed surface,
  the thin film stacks being laterally displaced one to another, and
  each thin film stack having a top surface that exhibits a value for the optical property that is different from a value for the optical property of at least one other said top surface.

2. An electrical device as described in claim 1, wherein the substantially uniform values of the optical property are substantially the same over a substantial portion of the wavelengths of visible light.

3. An electrical device as described in claim 1, wherein one or more of said thin film stacks includes a portion of an electrical component.

4. An electrical device as described in claim 1, wherein one or more of said thin film stacks includes a spectral normalization structure that normalizes the optical property, whereby the optical property does not vary substantially laterally over the exposed surface.

5. An electrical device as described in claim 4, wherein the normalized optical property over the exposed surface gives the exposed surface a uniform color, whereby the color does not vary substantially laterally over the exposed surface.

6. An electrical device as described in claim 1, wherein each said thin film stack is substantially transparent to visible light through the top surface thereof.

7. An electrical device as described in claim 1, wherein the optical property is selected from the group consisting of:

transmission;
reflection; and
absorption.

8. An electrical device comprising a plurality of laterally displaced regions each region being substantially transparent to visible light, wherein:
   a) each said laterally displaced region includes a normalized region surface that has a normalized region surface optical property, each said normalized region surface optical property being substantially the same, for one region in comparison to another;
   b) one said region includes a portion of an electrical component; and
   c) at least one said region has beneath the normalized region surface of the at least one said region:
      i) an additional surface that has a value for the optical property that is not substantially the same as the normalized value; and
      ii) a spectral normalization structure that is disposed with respect to the additional surface such that the normalized region surface of the at least one said region exhibits the normalized region surface optical property.

9. An electrical device as described in claim 8, wherein the at least one said region that includes the spectral normalization structure also includes the portion of the electrical component.

10. An electrical device as described in claim 8, wherein the visible light is included in a range of wavelengths of approximately 400 nm to approximately 700 nm.

11. An electrical device as described in claim 8, wherein the plurality of regions has a substantially uniform color when viewed by the human eye.

12. An electrical device as described in claim 8, wherein the optical property is selected from the group consisting of:
   transmission;
   reflection; and
   absorption.

13. An electrical device as described in claim 8, wherein: the electrical component is a semiconductor device; and the plurality of laterally displaced regions is disposed over a substrate.

14. A display device comprising:
   a housing;
   a light source disposed within the housing; and attached to the housing, a substantially transparent device through which light is transmitted from the light source, wherein the substantially transparent device includes:
   a) a substrate;
   b) an exposed surface that:
      i) exhibits an optical property that is substantially uniform along a lateral spatial dimension of the exposed surface and
      ii) is substantially transparent to visible light; and
   c) a plurality of thin film stacks:
      i) disposed between the substrate and the exposed surface;
      ii) the thin film stacks being laterally displaced one to another; and
      iii) each thin film stack having a stack top surface that exhibits a value for the optical property that is different from a value for the optical property of at least one other said stack top surface.

15. A display device as described in claim 14, wherein one or more of said thin film stacks includes a portion of an electrical component.

16. A display device as described in claim 14, wherein one or more of said thin film stacks includes a spectral normalization structure that substantially normalizes the optical property over the exposed surface.

17. A display device as described in claim 16, wherein the normalized optical property over the top surface gives the exposed surface a substantially uniform color.

18. A display device as described in claim 14, wherein each said thin film stack is substantially transparent to visible light through the top surface thereof.

19. A display device as described in claim 14, wherein the optical property is selected from the group consisting of:
   transmission;
   reflection; and
   absorption.

20. A method comprising:
   a) analyzing an electrical device that includes a plurality of regions displaced laterally along a spatial dimension, each region being substantially transparent to visible light, wherein:
      i) one said region includes at least a portion of an electrical component; and
      ii) a surface of a first said region has an optical property having a value that is not substantially the same as a value of the optical property of a surface of a second said region; and
   b) forming, based on the analysis, a spectral normalization structure that is disposed with at least one of the first and second said regions such that each said region of the plurality of regions includes a normalized surface having a normalized value for the optical property that is substantially the same, one region in comparison to another along the spatial dimension.

21. A method as described in claim 20, wherein the spectral normalization structure is disposed between layers that form the electrical component.

22. An electrical device formed by the method of claim 20.

23. An electrical device comprising a plurality of regions displaced laterally along a spatial dimension, each region being substantially transparent to visible light, wherein:
   each said region has a normalized surface that has an optical property that has a normalized value that is substantially the same, one region in comparison to another along the spatial dimension;
   one said region includes at least a portion of a means for providing an electrical function; and
   at least one said region includes beneath the normalized surface of the at least one said region:
   an additional surface having a value for the optical property that is not substantially the same as the normalized value; and
   means, disposed with the additional surface, for normalizing the optical property such that the normalized surface of the at least one said region has the normalized value.

* * * * *